United States Patent
Yoshida

(10) Patent No.: US 6,271,058 B1
(45) Date of Patent: *Aug. 7, 2001

(54) METHOD OF MANUFACTURING SEMICONDUCTOR DEVICE IN WHICH SEMICONDUCTOR CHIP IS MOUNTED FACEDOWN ON BOARD

(75) Inventor: Yuichi Yoshida, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,446

(22) Filed: Jan. 6, 1999

(30) Foreign Application Priority Data

Jan. 6, 1998 (JP) .................................................. 10-012014

(51) Int. Cl.[7] ........................... H01L 21/44; H01L 21/48; H01L 21/50; H01L 23/34
(52) U.S. Cl. ......................... 438/108; 438/121; 438/122; 257/718; 257/719; 257/727
(58) Field of Search ........................... 257/778, 779, 257/780, 738, 704, 707, 719; 438/108, 121

(56) References Cited

U.S. PATENT DOCUMENTS 5,188,280 * 2/1993 Nakao et al. .......................... 228/123
5,311,402 * 5/1994 Kobayashi et al. .................... 361/760
5,956,576 * 9/1999 Toy et al. ............................... 438/125

FOREIGN PATENT DOCUMENTS

| 62-160540 | 10/1987 | (JP) . |
| 62-249429 | 10/1987 | (JP) . |
| 2-135762 | 5/1990 | (JP) . |
| 4-83366 | 3/1992 | (JP) . |
| 4-346249 | 12/1992 | (JP) . |
| 5-21520 | 1/1993 | (JP) . |
| 5-21640 | 1/1993 | (JP) . |
| 5-36761 | 2/1993 | (JP) . |
| 5-343473 | 12/1993 | (JP) . |

OTHER PUBLICATIONS

"Microelectronics Packaging Handbook," Part I, edited by Rao R. Tummala, et al., 1997, pp. 124–25.*

* cited by examiner

Primary Examiner—Charles Bowers
Assistant Examiner—Nema Berezny
(74) Attorney, Agent, or Firm—Sughrue, Mion, Zinn, Macpeak & Seas, PLLC

(57) ABSTRACT

There is provided a method of manufacturing a semiconductor device that ensures the connection state and enhance structural stability, reliability and heat-radiation performance. In a first step, metal bumps are joined to one of electrodes on a semiconductor chip and connection pads on a board. In a second step, the semiconductor chip is adhered to join means. In a third step, join means is joined with the board for connecting the metal bumps with the electrodes or the connection pads.

8 Claims, 6 Drawing Sheets

METHOD OF MANUFACTURING SEMICONDUCTOR DEVICE IN WHICH SEMICONDUCTOR CHIP IS MOUNTED FACEDOWN ON BOARD

BACKGROUND OF THE INVENTION

1. Field of the Invention

The present invention relates to a method of manufacturing a semiconductor device and particularly, to a semiconductor device in which a method of manufacturing a semiconductor chip is mounted facedown on a board in the form of a bare chip.

2. Description of the Prior Art

As for a semiconductor device in which a semiconductor chip is facedown connected to a board in the form of a bare chip, there has been hitherto known a semiconductor device having such a structure that soldering materials such as Sn/Pb or the like is supplied to pads of a board in advance and metal bumps formed on the electrodes of a semiconductor chip are connected to the pads of the board by melting the soldering materials.

Such a structure necessarily rises up the manufacturing cost of the semiconductor device because soldering materials is fed to the pads of the board, and thus low-cost semiconductor devices needing no soldering materials has been researched and developed.

Japanese Patent Laid-open Publication No. 5-36761 discloses a semiconductor device having a connection structure requiring no soldering materials. According to the connection structure of this semiconductor device, electrodes formed on a semiconductor chip and pads that are formed on a board are connected to each other through metal bumps by using the curing shrinkage force of thermosetting resin.

The conventional semiconductor device connection structure will be described with reference to the drawings.

FIG. 17 is a cross-sectional view showing the conventional semiconductor device connection structure disclosed in Japanese Patent Laid-open Publication No. 5-36761.

In this semiconductor device connection structure, metal bumps 7 composed of elastically-deformable soft metals are formed on electrodes 6 formed on semiconductor chip 4 in order to connect the electrodes 6 of the semiconductor chip 4 with connection pads 8 of board 5. Thermosetting type resin 10 is inserted between the semiconductor chip 4 and the board 5.

Subsequently, the metal bumps 7 on the electrodes 6 and the connection pads 8 are confronted to each other, and then the semiconductor chip 4 is mounted on the board 5 so that the metal bumps 7 and connection pads 8 are brought into close contact with each other. Further, the structure is heated while weight is applied to press the semiconductor chip 4, whereby the resin 10 is cured, the metal bumps 7 are elastically deformed and the metal bumps 7 and connection pads 8 are brought into close contact with each other by the repulsive force of the metal bumps 7 to connect them.

Further, Japanese Patent Laid-open Publication No. 5-343473 discloses another conventional semiconductor device. In this case, the following method is used:

That is, electrodes of a semiconductor chip are positioned onto metal bumps formed on a board and then pressed until film-shaped insulating adhesive which is beforehand attached to the board or semiconductor chip is discharged from the gap between the semiconductor chip and the board, and at the same time the insulating adhesive is cured. In consequence, the semiconductor chip is fixed and connected to the board.

A first disadvantage of the above prior arts resides in that electrical connection cannot be kept with time lapse or under a high-temperature atmosphere. This is because the resin is used for the connection between the semiconductor chip and the board and the shrinkage force of resin is used to connect the metal bumps formed on the electrodes of the semiconductor chip with the connection pads of the board.

When the semiconductor device is kept in this state for a long term, the shrinkage force of resin may be reduced due to plastic deformation of the resin, so that the connection cannot be kept. When the semiconductor device is exposed to a high-temperature atmosphere, the thermal expansion of resin acts so that the semiconductor chip and the board are separated from each other, and the metal bumps and the connection pads are separates from each other. Therefore, the electrical connection cannot be kept.

Further, in the case where the semiconductor device is subjected to a thermal impact test such as a temperature cycle test or the like and the check of the electrical connection is performed in a room temperature state, even when the connection portions are actually separated from each other and thus the electrical connection state is not kept in a high-temperature state, it is estimated as if the electrical connection state is kept when the temperature is returned to the room temperature. In this case, it is misjudged as if there is no trouble in connection state.

A second disadvantage resides in that when a heat-radiating device is required, for example, in such a case that a semiconductor chip having a large heating value is used, an excessive force may be applied to the semiconductor chip when the heat-radiating device is installed.

The reason is as follows:

In order to enhance the heat-radiation performance, it is preferable that the heat conduction distance from the semiconductor device to the heat-radiating device such as a heat sink or the like is set as short as possible. Therefore, it is desirable that the heat-radiating device is directly attached to the semiconductor chip. However, when it is directly attached to the semiconductor chip, the weight of the heat-radiating device must be supported by the semiconductor chip, and this may cause a connection failure and damage to the semiconductor chip.

Therefore, it is required that the heat-radiation device is fixed to another member such as a board or the like to prevent excessive force from being applied to the semiconductor chip. However, in this case, a space to fix the heat-radiating device is needed, and this loses advantages of the high-density mounting effect obtained by connecting the semiconductor chip in the form of a bare chip.

SUMMARY OF THE INVENTION

Therefore, an object of the present invention is to provide a semiconductor device connection structure that can make sure the connection state between a semiconductor chip and a board, and enhance structural stability, connection reliability and heat-radiation performance.

According to the present invention, there is provided a method of manufacturing a semiconductor device in which a semiconductor chip is mounted facedown on a board, comprising the steps of: joining metal bumps to one of electrodes on a semiconductor chip and connection pads on a board; adhering the semiconductor chip to the join means; and joining the join means with the board for contacting the metal bumps with the electrodes or the connection pads.

The join means is joined to a fixing pad of the board at end portion thereof and thereby fixed to the board. At this time, metal bumps are formed on the electrodes of the semiconductor chip or the connection pads of the board, and the metal bumps are pressed against and connected to the connection pads on the board or the electrodes of the semiconductor chip by fixing the join means to the board.

That is, by joining the join means to the board so as to press the semiconductor chip, the metal bumps formed on the semiconductor chip and the connection pads of the board, or the metal bumps formed on the connection pads and the electrodes of the semiconductor chip are connected to each other under press.

In this case, soldering materials may be used for the joint between the join means and the board. Further, electrical welding may be performed for the joint between the join means and the board. Further, resin may be filled between the semiconductor chip and the board. The whole semiconductor chip may be covered by the join means. The join means may be made of metals or high heat-conductive materials containing metals.

It is preferable that the semiconductor chip is beforehand fixed to the join means made of metals or the like by using joint materials having high heat conductivity such as metals or the like. However, the join means may be joined to the semiconductor chip after the semiconductor chip is disposed on the board. That is, any structure may be adopted insofar as the semiconductor chip is finally pressed by the join means.

According to the present invention, the metal bumps formed on the electrodes of the semiconductor chip and the connection pads of the board, or the metal bumps formed on the connection pads of the board and the electrodes of the semiconductor chip are brought into contact with each other under pressure by using the force of fixing the join means to the board, so that the connection between the metal bumps formed on the electrodes of the semiconductor chip and the connection pads of the board, or the connection between the metal bumps formed on the connection pads of the board and the electrodes of the semiconductor chip can be firmly kept even when the temperature rises up, so that high-reliability connection can be achieved.

If the semiconductor chip is joined to the join means, when a heat-radiation device such as a heat sink or the like is installed, it is unnecessary to directly install the heat-radiation device to the semiconductor chip, and the heat-radiation device can be adhesively attached to the join means. Therefore, the weight of the heat-radiation device is supported by the join means, and no excessive force is applied to the semiconductor chip.

Further, the semiconductor chip can be joined to the join means made of metals or the like by using materials having high thermal conductivity such as metal alloy or the like, so that there appears no reduction in heat radiation performance due to use of the join means, and a semiconductor device having high heat radiation performance can be provided.

DETAILED DESCRIPTION OF THE PREFERRED EMBODIMENTS

Preferred modes according to the present invention will be described with reference to the accompanying drawings.

Figure 1:
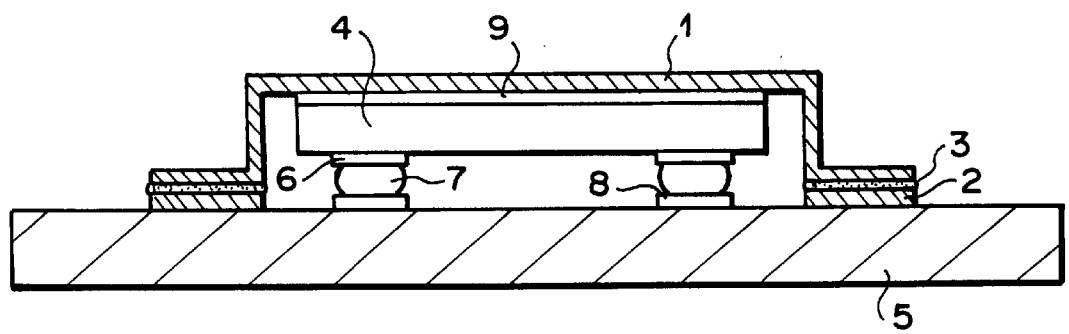
FIG. 1 is a cross-sectional view showing a first embodiment of the present invention.

FIG. 1 is a cross-sectional view showing a first mode according to the present invention.

Semiconductor chip 4 is fixed to join means 1 by using joint materials 9 of metals that has high thermal conductivity. The end portion of join means 1 is joined to fixing pad 2 formed on board 5 by using soldering materials 3. Further, metal bumps 7 are formed on electrodes 6 on the semiconductor chip 4, and the metal bumps 7 are pressed against connection pads 8 on the board 5 to achieve electrical connection between the electrodes 6 on the semiconductor chip 4 and the connection pads 8 on the board 5.

Figure 15:
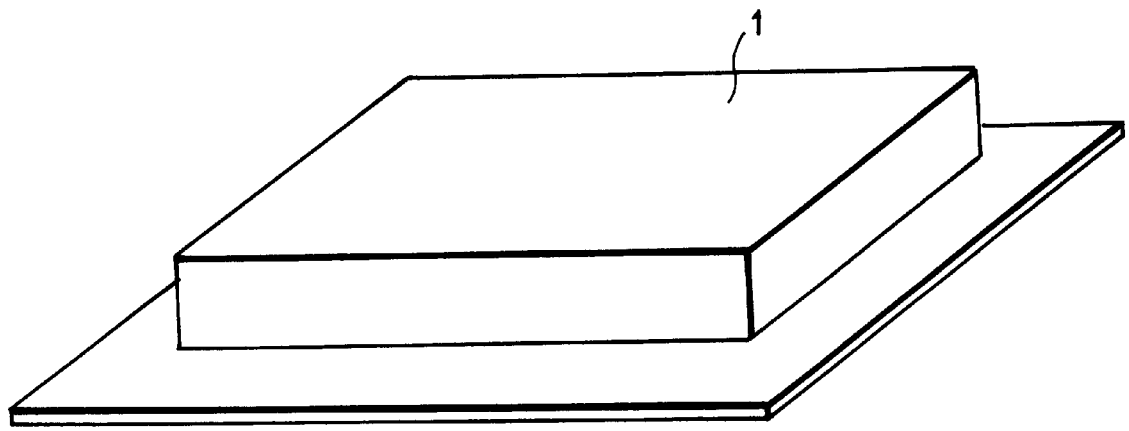
FIG. 15 is a perspective view showing a join means according to the present invention.

Electrical conductive materials such as soldering materials, electrical conductive resin or the like are not used between the metal bumps 7 and the connection pads 8 on the board 5, and they are connected to each other by using press force when the join means 1 is fixed to the board 5. Further, the join means 1 is designed to cover the semiconductor chip 4 as shown in FIG. 15, and the outer peripheral portion of the join means 1 is joined to the board 5. Therefore, resin sealing can be omitted by hermetically sealing the inside of the join means 1 with inert gas.

Figure 16:
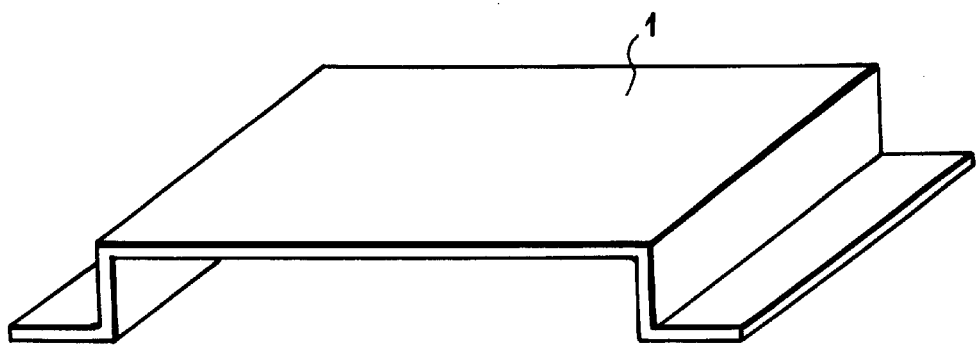
FIG. 16 is a perspective view showing another join means according to the present invention.
Figure 17:
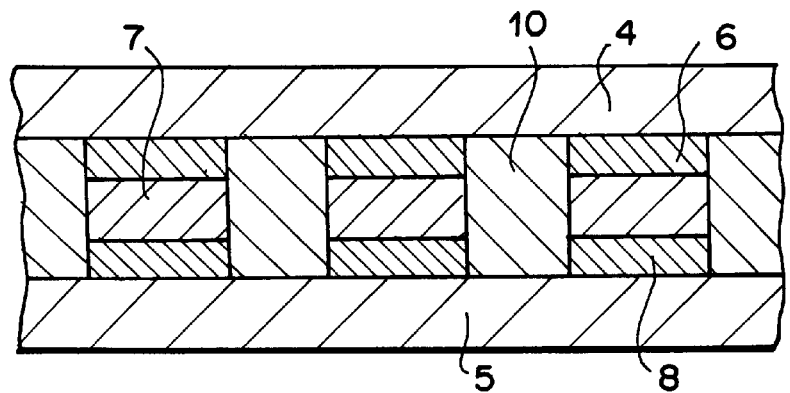
FIG. 17 is a cross-sectional view showing a conventional connection structure.
Figure 18:
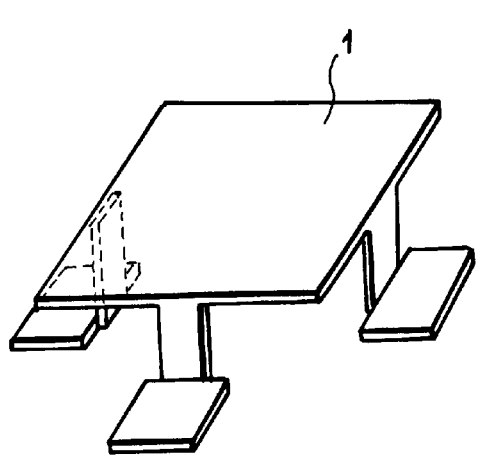
FIG. 18 is a perspective view showing third join means according to the present invention.
Figure 19:
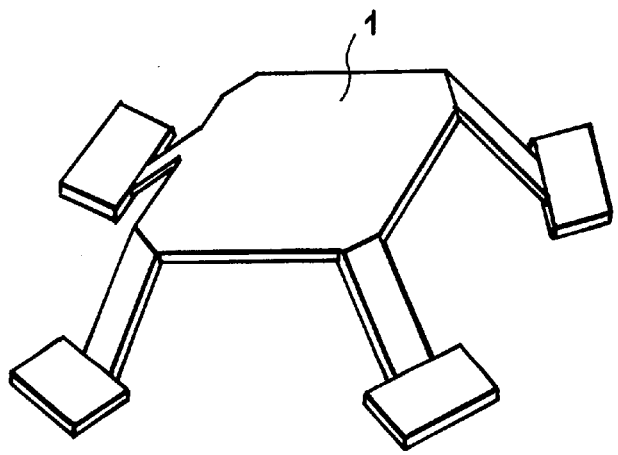
FIG. 19 is a perspective view showing the other join means according to the present invention.

Further, when no hermetic sealing is required, the join means 1 shown in FIG. 16 may be designed so that it does not only cover the semiconductor chip 4 in whole, but it is partially fixed to the board 5. Still further, the join means 1 may be designed so that it has the plural legs for fixing to the board 5. FIGS. 18 and 19 are perspective view showing the join means having the three and four legs respectively.

Next, the connection process of the first mode of the present invention will be described.

FIGS. 4 to 10 are process diagrams showing the connection process of the first mode.

Figure 4:
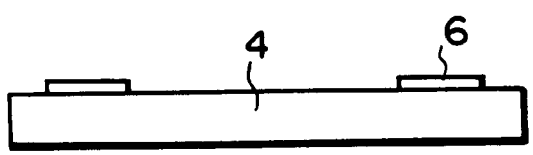
FIG. 4 is a process diagram showing a connection process of the fit embodiment of the present invention.
Figure 5:
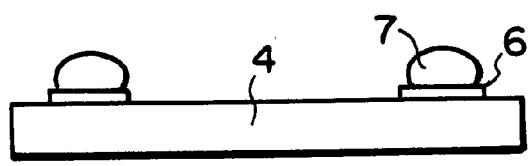
FIG. 5 is a process diagram showing the connection process of the first embodiment of the present invention.
Figure 6:
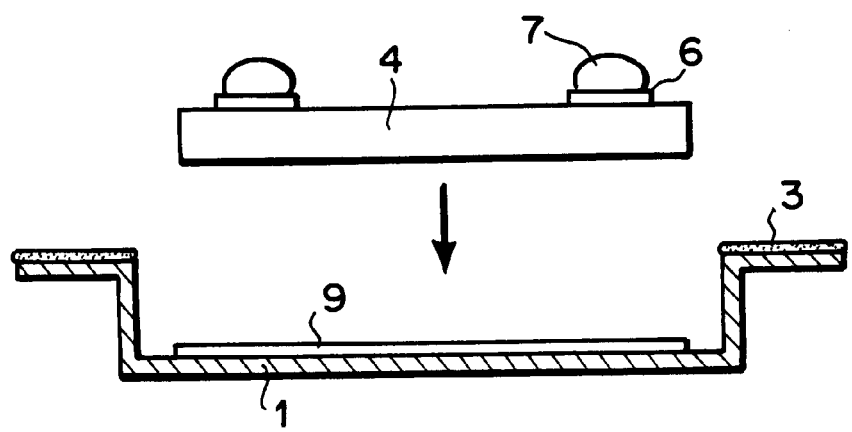
FIG. 6 is a process diagram showing the connection process of the first embodiment according to the present invention.

First, as shown in FIG. 5, the metal bumps 7 are formed on the electrodes 6 of the semiconductor chip 4 shown in FIG. 4. Subsequently, as shown in FIG. 6, joint materials 9 having high thermal conductivity such as connection materials of metals, resin containing metals is disposed on the join means 1 by coating or the like.

Figure 7:
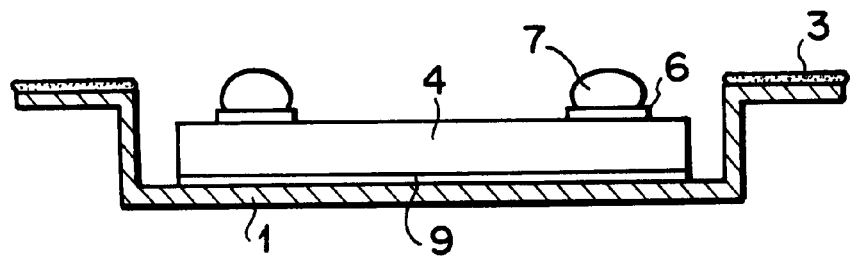
FIG. 7 is a process diagram showing the connection process of the first embodiment of the present invention.

Subsequently, the semiconductor chip 4 which the bumps 7 are formed as shown in FIG. 5 are disposed on the joint materials 9 of the join means 1 as shown in FIG. 7 and pressed while being heated. Accordingly, the back surface of the semiconductor chip 4 is adhered to the join means 1.

Figure 9:
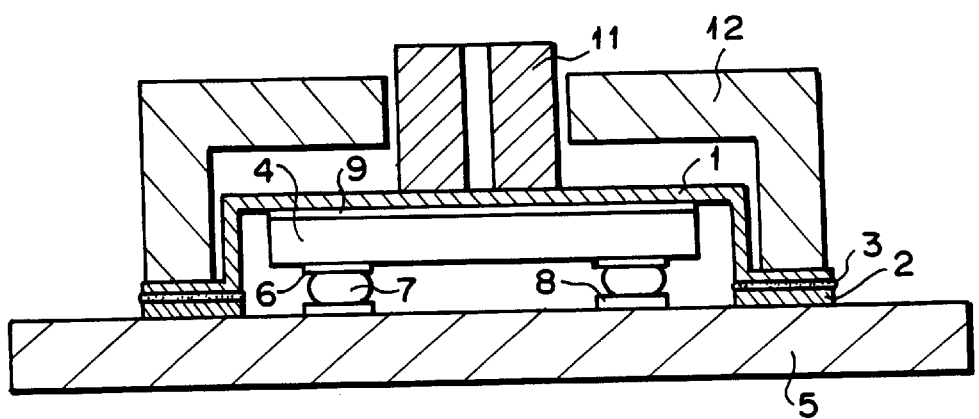
FIG. 9 is a process diagram showing the connection process of the first embodiment of the present invention.

Further, the join means 1 adhering to the semiconductor chip 4 is fixed under suction by using suction implement 11 so that the metal bumps 7 on the semiconductor chip 4 are put facedown, and disposed so that the connection pads 8 on the board 5 and the metal bumps 7 are positioned to each other. The suction implement 11 is made of materials such as metal, ceramic, gum, plastic and has a hole connected to an exhaust system. In FIG. 9, the suction portion of the suction implement is disclosed.

At this time, the structure is set so that the end portion of the join means 1 and the fixing pads 2 on the board 5 are positionally coincident with each other. In addition, the soldering materials 3 is fed to the end portion of the join means 1 or the fixing pads 2 on the board 5.

Figure 10:
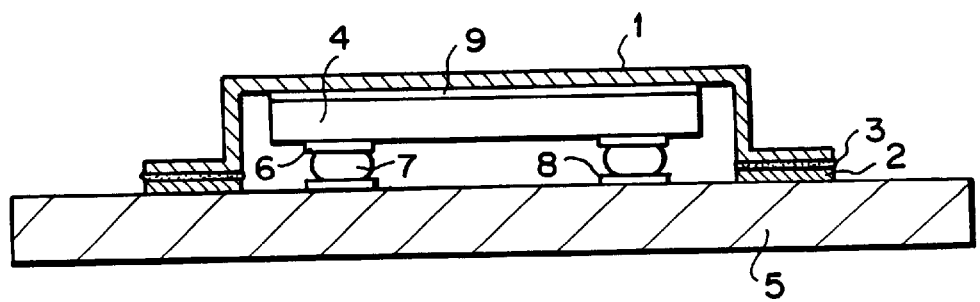
FIG. 10 is a process diagram showing the connection process of the first embodiment of the present invention.

Subsequently, as shown in FIG. 9, the end portion of the join means 1 is brought into contact with the connection pad 2 on the board 5 while the join means 1 is fixed under suction by using the suction implement 11, and heated under pressure by heating implement 12 to melt the soldering materials 3, and thereby the join means 1 and the board 5 are joined. At this time, the metal bumps 7 and the connection pads 8 on the board 5 are brought into contact with each other under pressure. The heating implement 12 is made of materials such as metal, ceramic and heated by a heater. In FIG. 9, the heating portion of the heating implement is disclosed. Thereafter, the heating implement 12 and the suction implement 11 are removed to achieve a semiconductor device as shown in FIG. 10.

Next, the effect of the first mode will be described.

In the first mode of the present invention, the connection between the semiconductor chip and the board is performed with soldering materials by using the join means, and thus no thermal expansion of resin appears when the temperature rises up unlike the resin sealing, so that there occurs no electrical connection failure.

Further, as another effect, since the semiconductor chip is beforehand fixed to the join means, the heat-radiation device such as a heat sink may be installed to the join means (not the semiconductor chip). In this case, the join means has been already fixed to the board, and thus no excessive force is applied to the semiconductor chip due to the weight of the heat-radiation device.

Further, with respect to the heat radiation, the semiconductor chip can be joined to the join means by the metal materials which can join at high temperature and has high thermal conductivity, a semiconductor device manufactured has excellent thermal conduction, and also it has high heat radiation performance by designing the join means so as to be provided with fins or pins.

Further, the join means also serves as a compact heat-radiation plate, and thus the semiconductor device has a structure having more excellent heat radiation performance as compared with a case where the semiconductor chip is connected to the board with no join means.

Still further, when the join means 1 is designed so as to cover the semiconductor chip 4, an electromagnetic wave shielding effect can be obtained.

Next, a second mode of the present invention will be described with reference to the accompanying drawings.

Figure 2:
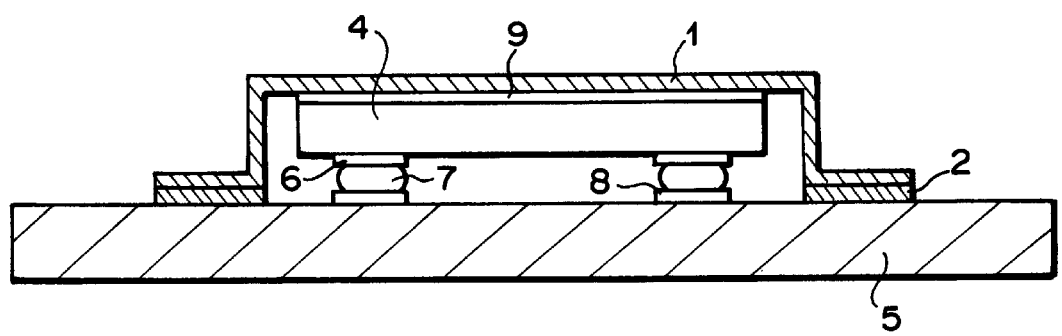
FIG. 2 is a cross-sectional view showing a second embodiment according to the present invention.

FIG. 2 is a cross-sectional view showing a second mode according to the present invention. Unlike the first mode of FIG. 1, no soldering materials 3 is applied to the connection portion between the end potions of the join means 1 and the fixing pad 2 of the board 5, and the end potions of the join means 1 and the fixing pad 2 of the board 5 are directly joined to each other by electrical welding.

Figure 11:
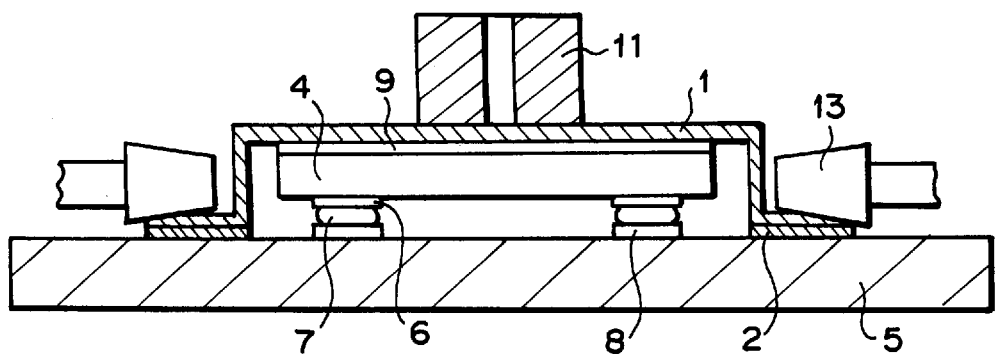
FIG. 11 is a process diagram showing the connection process of the second embodiment according to the present invention.

Next, the connection process of the second mode will be described. FIG. 11 is a diagram showing a substitute process of the process (FIG. 9) in which the join means 1 and board 5 are connected to each other by a heating implement 12. The same processes as the first mode shown in FIGS. 4 to 8 and FIG. 10 are used in the second mode.

In the second mode, no soldering materials 3 is used, and thus the electrical welding based on electrode tool 13 is carried out in place of the heating based on the heating implement 12. In this case, as shown in FIG. 11, the end portion of the join means 1 and fixing pad 2 on the board 5 are electrically welded by using the electrode tool 13. Therefore, soldering materials as shown in the first mode is not needed, and after the connection, the end portion of the join means 1 and fixing pad 2 are directly joined to each other.

Next, a third mode according to the present invention will be described with reference to the drawings.

Figure 3:
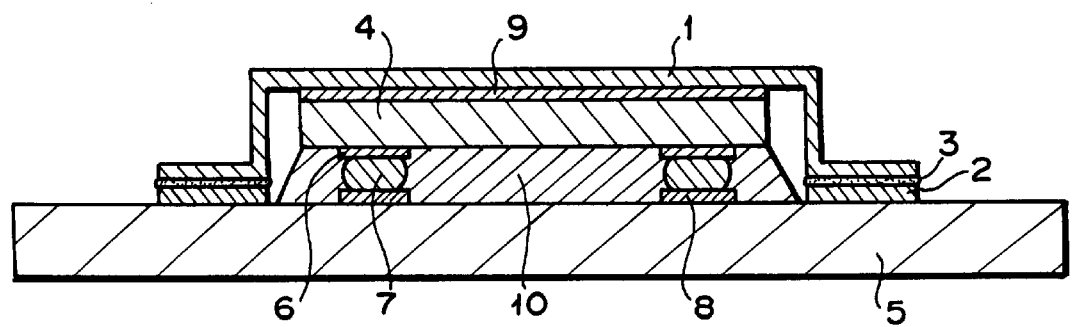
FIG. 3 is a cross-sectional view showing a third embodiment according to the present invention.

FIG. 3 is a cross-sectional view showing a third mode of the present invention. It is the basically same structure as the first and second modes that the semiconductor chip 4 is connected to the board 5 by using the join means 1.

However, in the third mode, the gap between the semiconductor chip 4 and the board 5 is sealed by resin 10. In FIG. 3, the joint between the join means 1 and the board 5 is performed by using the soldering materials 3, however, it may be performed by using the electrical welding with no soldering materials as in the case of the second mode. The shape of the join means 1 used in the third mode may be set so that the join means 1 covers the semiconductor chip 4 in whole as shown in FIG. 15 or the side surfaces of the join means are exposed as shown in FIG. 16. Further, the join means 1 may be designed so that it has the plural legs for fixing to the board 5. FIGS. 18 and 19 are perspective view showing the join means having the three and four legs respectively.

Next, the connection process of the third mode according to the present invention will be described with reference to the drawings.

Figure 8:
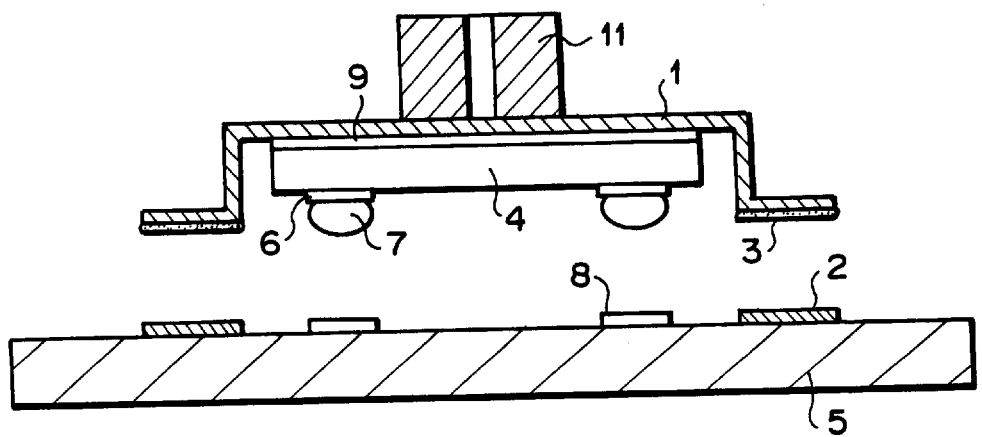
FIG. 8 is a process diagram showing the connection process of the first embodiment of the present invention.
Figure 12:
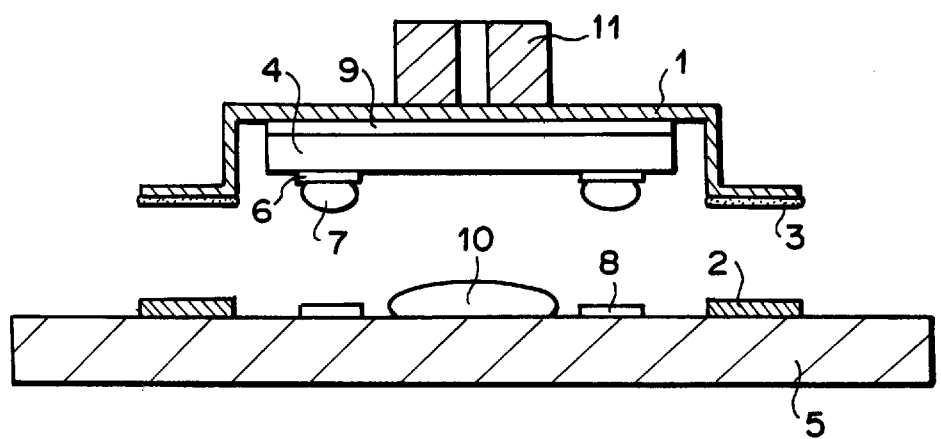
FIG. 12 is a process diagram showing the connection process of the third embodiment of the present invention.
Figure 13:
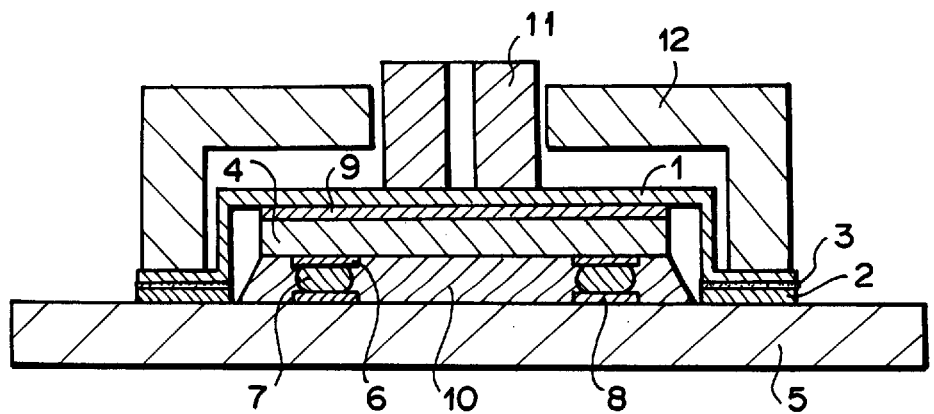
FIG. 13 is a process diagram showing the connection process of the third embodiment of the present invention.
Figure 14:
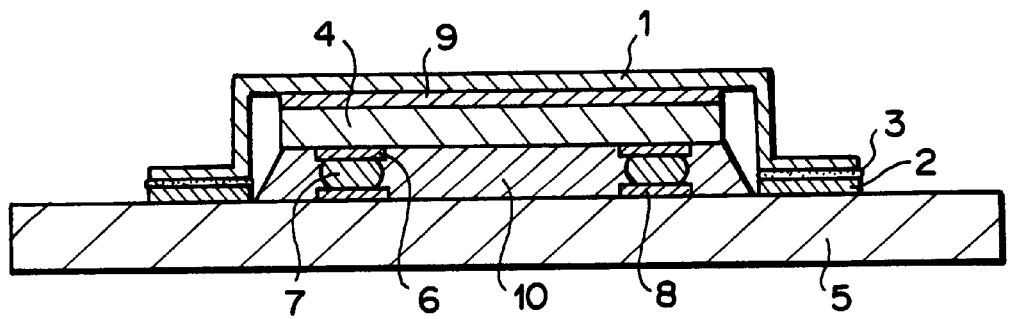
FIG. 14 is a process diagram showing the connection process of the third embodiment of the present invention.

FIGS. 12, 13 and 14 show a substitute process for the process of FIGS. 8, 9 and 10 showing the connection process of the first mode. The same processes as shown in FIGS. 4 to 7 in the first mode are used in the third mode.

In the third mode, when the join means 1 adhering to the semiconductor chip 4 is joined to the board 5, the sealing resin 10 is beforehand fed onto the board 5 as shown in FIG. 12. When the join means 1 and board 5 are joined to each other and the metal bumps formed on the electrodes 6 of the semiconductor chip 4 and the connection pads 8 of the board are connected to each other, a sufficient amount of resin is fed to the board 5 so that the resin 10 is filled in the gap between the semiconductor chip 4 and the board 5.

Subsequently, the end potion of the join means 1 is heated and joined to the fixing pad on the board 5 by the heating implement 12 while the join means 1 is fixed and pressed by using the suction implement 11 as shown in FIG. 13, thereby fixing the semiconductor chip 4 to the board 5 with the join means 1 as shown in FIG. 14.

Here, the electrical welding used in the second mode shown in FIG. 11 may be used as a method of fixing the join means 1 to the board 5. Further, when the shape of the join means 1 is designed so that it does not perfectly cover the semiconductor chip 4, it may be adopted that the resin 10 is not fed at the time when the join means 1 is joined to the board 5 as shown in FIGS. 12 to 14, but poured after the join means 1 is joined to the board 5.

[Embodiments]

Next, a first embodiment according to the present invention will be described with reference to the drawings.

FIG. 1 is a cross-sectional view showing a first embodiment according to the present invention. The semiconductor chip 4 is fixed to the join means 1 of metals such as Cu, Al or the like by heating and melting joint materials 9. Joint materials 9 is made of metal materials such as Au/Si alloy or the like, or resin whose contains a large amount of materials having high thermal conductivity, for example, metals such as Ag or the like or ceramic materials such as BN or the like. Ceramic materials such as aluminum oxide, aluminum nitride or the like may be used for portions other than the end portion of the join means 1 at which the join means 1 is joined to the fixing pad 2. The end portion of the join means 1 is fixed to the fixing pad of metals such as Cu, Au or the like formed on the board 5 by using soldering materials 3 of Sn/Pb or the like.

The metal bumps 7 made of Au, alloy of Au or soldering materials are formed on the electrodes 6 of the semiconductor chip 4, and they are brought into contact with the connection pads 8 on the board 5 to achieve electrical connection.

The connection between the metal bumps 7 and the connection pads 8 of metals such as Au, Cu or the like on the board 5 is performed without using soldering materials or materials such as conductive resin or the like other than the metal bumps 7 and by the pressure based on the press force when the join means 1 is fixed to the board 5.

Further, the join means 1 is designed as shown in FIG. 15 so as to cover the semiconductor chip 4, and the outer peripheral portion thereof is joined to the board 5. The inside of the join means 1 is hermetically sealed by inert gas such as nitrogen or the like, and thus the resin sealing is unnecessary.

Further, when no hermetic sealing is required, the join means 1 shown in FIG. 16 may be designed so that it does not only cover the semiconductor chip 4 in whole, but it is partially fixed to the board 5. Still further, the join means 1 may be designed so that it has the plural legs for fixing to the board 5. FIGS. 18 and 19 are perspective views showing the join means having the three and four legs respectively.

Next, the connection process of the first embodiment will be described with reference to FIGS. 4 to 10.

First, as shown in FIG. 5, the metal bumps 7 of alloy of Au, soldering materials such as Sn/Pb or the like are formed on the electrodes 6 of the semiconductor chip 4 as shown in FIG. 4.

Subsequently, the joint materials 9 of metals such as Au/Si alloy or the like, or resin containing a large amount of metals of Ag or the like or ceramics having high thermal conductivity such as BN or the like is coated or disposed on the join means 1 as shown in FIG. 6.

Subsequently, the semiconductor chip 4 on which the bumps 7 are formed as shown in FIG. 5 is disposed on the joint materials 9 of the join means 1 as shown in FIG. 7, and pressed while heated up to the melting point of the joint materials. Accordingly, the back surface of the semiconductor chip 4 is adhered to the join means 1.

Further, as shown in FIG. 8, the join means 1 to which the semiconductor chip 4 adheres is fixed under suction by using the suction implement 11 so that the metal bumps 7 of Au, Au alloy or soldering materials are put facedown, and then the connection pads 8 of metals such as Au, Cu or the like on the board 5 and metal bumps 7 are positionally coincident with each other and are disposed.

In this case, the structure is designed so that the end portion of the join means 1 and the fixing pad 2 of metals such as Au, Cu or the like are also positionally coincident with each other. Further, the soldering materials 3 of Sn/Pb or the like is fed to the end portion of the join means 1 or the fixing pad 2 on the board 5.

Subsequently, as shown in FIG. 9, the end portion of the join means 1 is brought into contact with the connection pad 2 on the board 5 and while the join means 1 is fixed under suction by using the suction implement 11, the soldering materials 3 is heated and melted under pressure by using the heating implement 12, thereby joining the join means 1 to the board 5. The board 5 may be heated by using another heating device (not shown) to melt the soldering materials. In this case, the pressure is applied at the same time with heating, and thus the join means 1 and board 5 are joined and fixed to each other while the metal bumps 7 and the connection pads 8 on the board 5 are pressure-contacted. Finally, the heating implement 12 and suction implement 11 are removed to achieve a semiconductor device shown in FIG. 10.

Next, a second embodiment according to the present invention will be described with the drawings.

FIG. 2 is a cross-sectional view showing the second embodiment. unlike the first embodiment of FIG. 1, no soldering materials 3 is applied to the connection portion of the end portion of the join means 1 and the fixing pad 2 of the board 5, and the end portion of the join means 1 and the fixing pad 2 of the board 5 are joined to each other by electrical welding. In this case, the join means 1 and the fixing pad 2 of the board 5 are made of metals such as covar or the like which is suitable for melting joint by electrical welding. The other construction is the same as the first embodiment.

Next, the connection process of the second embodiment will be described. The semiconductor device of this embodiment is manufactured by using the same process as the first embodiment shown in FIGS. 4 to 8 and FIG. 10 except for the following process:

In the second embodiment, no soldering materials 3 is used, and thus the electrical welding is performed by using electrode tool 13 in place of the heating by the heating implement 12. In this case, as shown in FIG. 11, current is applied to the end portion of the join means 1 of covar or the like and the fixing pad 2 of metals such as metals of covar or the like to electrically weld them by using the electrode tool 13. Therefore, such soldering materials 3 as used in the first embodiment is unnecessary, and after the connection, the end portion of the join means 1 and the fixing pad 2 are directly melted and joined to each other.

Next, a third embodiment according to the present invention will be described.

FIG. 3 is a cross-sectional view showing a third embodiment of the present invention. The same point as the first and second embodiments resides in that the semiconductor chip 4 is connected to the board 5 by using the join means 1. However, difference of the third embodiment from the first and second embodiments resides in that the gap between the semiconductor chip 4 and the board 5 is sealed by thermosetting resin 10.

In FIG. 3, the soldering materials 3 is used for the joint between the join means 1 and the board 5, however, the connection may be performed by using the electrical welding in place of the soldering materials as in the case of the second embodiment. The shape of the join means 1 being used may be such a shape that the join means 1 covers the semiconductor chip 4 in whole as shown in FIG. 15 or such a shape that the side surface of the join means 1 is exposed as shown in FIG. 16. Still further, the join means 1 may be designed so that it has the plural legs for fixing to the board 5. FIGS. 18 and 19 are perspective views showing the join means having the three and four legs respectively.

Next, the connection process of the third embodiment will be described with reference to FIGS. 12 and 13.

FIGS. 12, 13 and 14 show a substitute process for the connection process of the first embodiment shown in FIGS. 8, 9 and 10. The semiconductor device of this embodiment is manufactured by using the same processes as the first embodiment shown in FIGS. 4 to 7 except for the processes of FIGS. 8 to 10.

In the third embodiment, when the join means 1 to which the semiconductor chip 4 adheres is joined to the board 5, thermosetting resin 10 of epoxy group, silicone group or the like is beforehand fed onto the board 5 as shown in FIG. 12.

When the join means 1 and board 5 are joined to each other and the metal bumps 7 formed on the electrodes 6 of the semiconductor chip 4 and the connection pads 8 of the board 5 are connected to each other, a sufficient amount of resin is fed so that the gap between the semiconductor chip 4 and the board 5 is filled with the resin.

Subsequently, as shown in FIG. 13, the end portion of the join means 1 is joined to the fixing pad 2 on the board 5 by the heating implement 12 while the join means 1 is fixed and pressurized by the suction implement 11, whereby the semiconductor chip 4 is fixed to the board 5 by using the join means 1 as shown in FIG. 14.

In this case, the electrical welding may be used to fix the join means 1 to the board 5 as in the case of the second embodiment. Further, when the shape of the join means 1 is not set so as to perfectly cover the semiconductor chip 4, the resin 10 may be fed not when the join means 1 is joined to the semiconductor chip 4 but after the join means 1 is joined to the board 5.

As described above, according to the present invention, the metal bumps formed on the electrodes of the semiconductor chip and the connection pads of the board, or the metal bumps formed on the connection pads of the board and the electrodes of the semiconductor chip are pressure-contacted to each other by using the force of fixing the join means to the board so that the semiconductor chip is pressed by the join means. Therefore, the connection between the metal bumps formed on the electrodes of the semiconductor chip and the connection pads of the board, or the connection between the metal bumps formed on the connection pads of the board and the electrodes of the semiconductor chip is not broken even when the temperature rises up. Accordingly, no electrical connection failure occurs, and high-reliability connection can be obtained.

Further, since the semiconductor chip is joined to the join means, when a heat-radiation device such as a heat sink or the like is installed, it is unnecessary to directly install the heat-radiation device to the semiconductor chip, and no excessive force is applied to the semiconductor chip.

Still further, the semiconductor chip can be joined to the join means by using the materials having high thermal conductivity such as metal alloy or the like, and thus a semiconductor device having excellent heat radiation performance can be provided.

If the shape of the join means is set so as to perfectly cover the overall semiconductor chip, the shielding effect of electromagnetic wave can be achieved.

What is claimed is:

1. A method of manufacturing a semiconductor device in which a semiconductor chip is mounted facedown on a board, comprising the steps of:

joining metal bumps to one of electrodes on said semiconductor chip and connection pads on said board;

adhering said semiconductor chip to join means; and joining said join means with said board for contacting said metal bumps with said electrodes or said connection pads.

2. The method as claimed in claim 1, wherein said join means is joined with a fixing pad which is provided on said board.

3. The method as claimed in claim 1, wherein the join between said join means and said board is performed by using soldering materials.

4. The method as claimed in claim 2, wherein the join between said join means and said board through said fixing pad is performed by using soldering materials.

5. The method as claimed in claim 1, wherein the join between said join means and said board is performed by using electrical welding.

6. The method as claimed in claim 2, wherein the join between said join means and said board through said fixing pad is performed by using electrical welding.

7. The method as claimed in claim 1, wherein a gap between said semiconductor chip and said board is filled with resin.

8. The method as claimed in claim 1, wherein said join means is made of metals or thermally conductive materials containing metals.

* * * * *